United States Patent [19]

Baumgart et al.

[11] Patent Number: 4,990,464
[45] Date of Patent: Feb. 5, 1991

[54] METHOD OF FORMING IMPROVED ENCAPSULATION LAYER

[75] Inventors: Helmut Baumgart, Mahopac, N.Y.; Andre Martinez, Derry, N.H.

[73] Assignee: North American Philips Corp., New York, N.Y.

[21] Appl. No.: 292,606

[22] Filed: Dec. 30, 1988

[51] Int. Cl.$^5$ ............................................. H01L 21/20
[52] U.S. Cl. ...................................... 437/83; 437/173; 437/973; 148/DIG. 154; 148/DIG. 152
[58] Field of Search ..................... 437/83, 84, 19, 56, 437/773, 973; 148/DIG. 152, DIG. 154

[56] References Cited

U.S. PATENT DOCUMENTS

| | | | |
|---|---|---|---|
| 4,543,133 | 9/1985 | Mukai | 437/19 |
| 4,590,130 | 5/1986 | Cline | 437/56 |
| 4,743,567 | 5/1988 | Pandya et al. | 437/84 |

FOREIGN PATENT DOCUMENTS 0129418  7/1984  Japan .................................. 437/83

OTHER PUBLICATIONS

"Investigation of the Si Beading Phenomena During Zone Melting Recrystallization", Weinberg et al; Appl. Phys. Lett., vol. 43, No. 12, 12/83, pp. 1105-1107.
"Wetting Angles and Surface Tension in the Crystallization of Thin Liquid Film", Yablonovitch et al; J. Electrochem. Soc; vol. 131, No. 11; 11/89; pp. 2625-2630.
"Focused Lamp Zone Melting Recrystallization of Silicon on Insulating Substrates"; Sakurai; J. Electrochem. Soc; Jul. 86; vol. 133, No. 7; pp. 1485-1488.
J. Electrochem. Soc., vol. 129, pp. 2812-2818 (Dec. 1982); "Zone-Melting Recrystallization of Si Films with a Moveable-Strip-Heater Oven"; Geis et al.

*Primary Examiner*—Brian E. Hearn
*Assistant Examiner*—Trung Dang
*Attorney, Agent, or Firm*—William L. Botjer

[57] ABSTRACT

An improved technique for forming silicon-on insulator films for use in integrated circuits. The technique provides an improved encapsulation layer to enable in a reproducible way the zone melt recrystallization of such films. The encapsulation layer consists of a first layer of a doped SiO$_2$ (silicate glass) on which a further layer of Si$_3$N$_4$ is deposited. The doped SiO$_2$ forms a fusible glassy material which is rendered semi-liquid and flows at the temperatures used in recrystallization. The softening of the encapsulation material accommodates volume expansion and eliminates the biaxial stresses in the layered structure. The Si$_3$N$_4$ layer adds mechanical strength to the SiO$_2$ layer and improves the wetting angle.

14 Claims, 1 Drawing Sheet

METHOD OF FORMING IMPROVED ENCAPSULATION LAYER

BACKGROUND OF THE INVENTION

The present invention is directed to improved techniques for forming silicon-on-insulator (SOI) films for use in integrated circuits, particularly in providing an improved encapsulation layer for zone-melt recrystallization of SOI films.

The technology for manufacturing SOI devices has recently undergone significant changes. These changes have occurred since the development of three dimensional integrated circuits. However, certain problems have arisen in obtaining a yield good enough for workable SOI devices particularly where the poly-silicon or amorphous silicon ($\alpha$-Si) layer is transformed into a single crystal layer by the zone melting recrystallization process.

In carrying out zone melting recrystallization, the prior art has encountered various problems by virtue of stresses occurring from the anomalous 9 % volume expansion during phase changes of the silicon, as well as the large biaxial tensile stresses at the silicon-silicon dioxide interfaces. These biaxial tensile stresses are created by the differential thermal expansion and contraction of the various layers of material in a typical SOI structure (e.g. Si and $SiO_2$).

Work has been reported by Geis et al, *J. Electrochem. Soc.*, Vol. 129, pages 2812-2818 (Dec. 1982) directed to zone melting recrystallization of silicon films using movable strip heater ovens in which an encapsulation of $SiO_2$-$Si_3N_4$ was attempted. This encapsulation layer was not successful inasmuch as such effects as film agglomeration, film delamination, void formation, and film thickness variation due to mass transport occurred too frequently for practical applications because of the difficulties in controlling sputtering for $Si_3N_4$ deposition.

A later effort by Sakurai, reported in *J. Electrochem. Soc.: Solid-State Science and Technology* Vol. 133, No. 7, pages 1485-1488 (July 1986) also was concerned with the use of capping layers and utilized the same silicon dioxide-silicon nitride layers of Geis. However, in attempting to demonstrate that no measurable impurity redistribution occurred in the substrate underneath the dielectric isolation layer during recrystallization of a 0.4 $\mu$m poly-silicon film, Sakurai formed the layer of poly-silicon with a capping layer of phosphosilicate glass (PSG) and an underlying composite layer of silicon nitride/PSG/silicon nitride over an arsenic implanted silicon substrate in order to get higher thermal impedance and to protect the substrate. This experiment was designed to demonstrate 3-D integration feasibility. Sakurai's thin PSG layer by itself, does not hold up to the severe conditions of beam induced zone melting recrystallization of the underlying silicon film so that extensive film delamination and conglomeration can result.

The efforts of the prior art have been unable to prevent large biaxial tensile stresses and to circumvent the deleterious effects of the anomalous 9 % volume expansion of the silicon layer during recrystallization. Accordingly, practical and reproducible SOI devices with consistently high yield have not been formed by the prior art techniques.

SUMMARY OF THE INVENTION

The present invention provides a technique for overcoming the problems of the prior art SOI processes by providing a reliable crucible to contain the melt during thin film crystal growth of Si by forming a composite encapsulation layer of doped $SiO_2$/$Si_3N_4$. The composite encapsulation structure of the present invention accommodates volume expansion of the silicon layer and eliminates the biaxial interfacial tensile stresses. This is accomplished according to the present invention by forming silicate glasses by doping the $SiO_2$ encapsulation layer during CVD deposition with either phosphorous, boron, or arsenic or preferably a combination thereof such as boron and phosphorous to form a glassy material, such as phosphosilicate glass (PSG), borosilicate glass (BSG), arsenosilicate or borophosphosilicate glass (BPSG). Such glasses are rendered semi-liquid and flow from about 850° C. to 1400° C.

The softening of the encapsulation material accommodates the Si layer volume expansion and eliminates the biaxial interfacial stresses, because a liquid cannot sustain any sheer stresses that would otherwise destroy the film and/or lead to delamination, as has occurred in the prior art processes. Deposited on the $SiO_2$ layer is a $Si_3N_4$ layer which adds mechanical strength to the $SiO_2$ layer and improves the wetting angle.

BRIEF DESCRIPTION OF THE DRAWINGS

The invention will be described without limitation by reference to the drawing figures in which.

DESCRIPTION OF THE PREFERRED EMBODIMENTS

Figure 1:
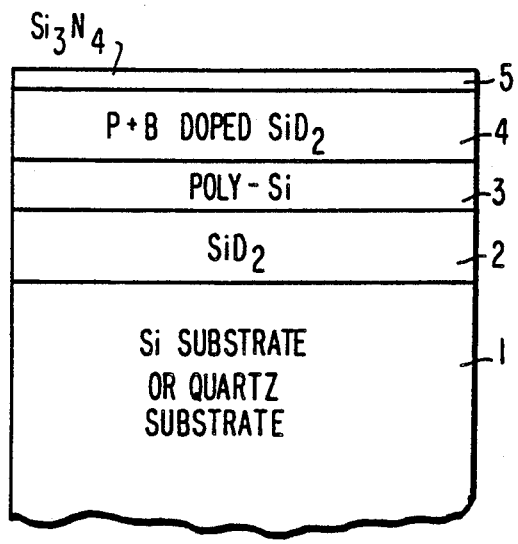
FIG. 1 illustrates the composite encapsulating layer formed over a SOI device according to the present invention.

The present invention provides an improved SOI device in which the polycrystalline silicon or $\alpha$-silicon film is encapsulated by a composite layer which serves as crucible for thin film crystal growth of Si to contain the melt in a reliable way. As may be seen in FIG. 1, a very thin polycrystalline silicon or $\alpha$-Si film 3 of approximately 0.5 microns, is deposited by chemical vapor deposition (CVD) onto a layer 2 of $SiO_2$, which is thermally grown or CVD deposited onto a substrate layer 1 which may be of silicon, quartz material, sapphire or any other suitable substrate material.

The polycrystalline silicon film 3 is thereafter encapsulated with a combined layer of a silicate glass (doped $SiO_2$) layer 4 and a $Si_3N_4$ layer 5. This encapsulating layer is produced by a chemical vapor deposition (CVD) at low pressure (LPCVD). The low temperature fusible silicate glass layer 4 may have a thickness of 1 or 2 microns, and be doped up to 3-6 percent with either phosphorous, boron, or arsenic or preferably both boron and phosphorous. Elements from Group III and V of the periodic table, such as boron and phosphorous are network formers in pure silica glass and form phosphosilicate glass (PSG) or borosilicate glass (BSG). A boron and phosphorous doped silicon dioxide layer 4 (BPSG) is a particularly suitable encapsulating layer since it constitutes a low temperature fusible silicate glass which flows at temperatures of 300° C. below that of conventional silicate glasses, is soft, pliable and fusible so as to annihilate strain from the underlying recrystallized Si layer 3 so that persistent brittle fracture problems of the undoped pure oxide are avoided.

In the example shown, using a phosphorous and boron (BPSG) doping of the $SiO_2$ layer 4, this layer is soft enough at elevated temperatures to absorb the anomalous 9% volume expansion of the phase change of the beam fused poly-silicon layer 3 from liquid silicon to solid silicon plus the stresses induced by the factor of six difference in linear thermal expansion coefficient between Si and $SiO_2$ as well as by the motion and mass transfer of the molten silicon during the beam induced zone-melting process.

The second layer 5 of $Si_3N_4$ is deposited by low pressure chemical vapor deposition (LPCVD) to a thickness of about 600 angstroms in order to add mechanical strength to the system. The $Si_3N_4$ layer 5 serves a dual purpose in that it firstly adds considerable mechanical strength to the composite encapsulation layer due to its hardness and higher melting point (1900° C.) which properties enable the $Si_3N_4$ to effectively contain the soft pliable and fusible borophosphosilicate glass (BPSG) layer 4. Secondly, the $Si_3N_4$ layer 5 serves to reduce the wetting angle at the liquid Si-$SiO_2$ outer face of the encapsulation layer from $\theta=87°$ to a wetting angle of $\theta=25°$ for a liquid silicon - (oxynitride and silicon nitride) interface.

Figure 2:
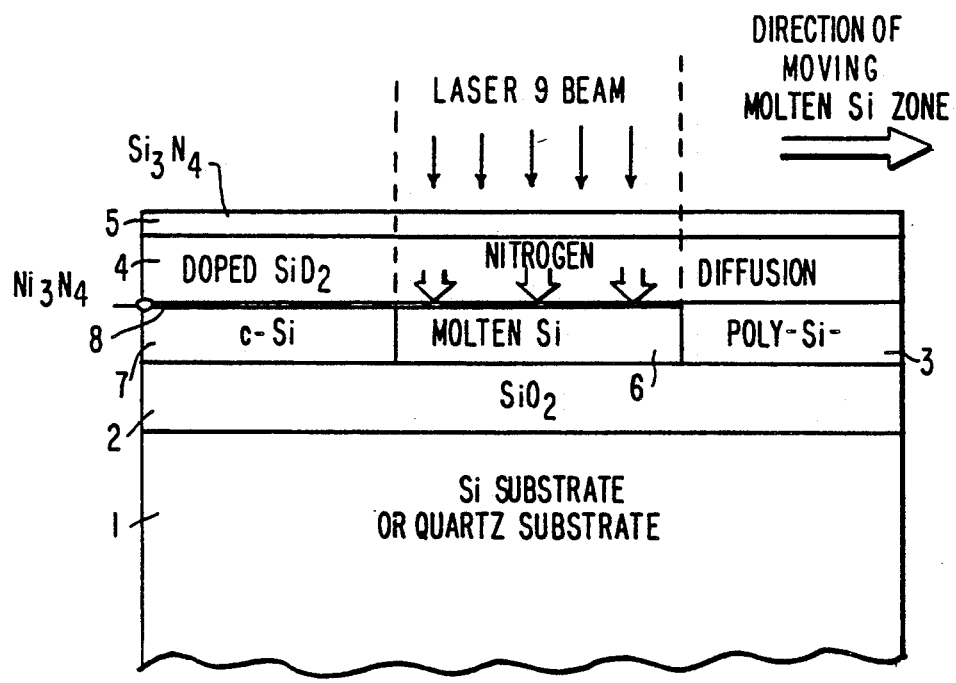
FIG. 2 illustrates the doped composite encapsulation layer of the present invention undergoing zone melting recrystallization of the poly-silicon layer.

This reduction in wetting angle occurs, as shown in FIG. 2 because upon the zone melting recrystallization procedure caused by scanning a laser beam 9 over the polycrystalline silicon layer 3, nitrogen from the $Si_3N_4$ layer 5 diffuses through the underlying doped $SiO_2$ layer 4 to segregate at the interface between the poly-silicon layer 3 and the doped $SiO_2$ layer 4. An extremely thin $Si_3N_4$ and oxynitride film 8 is formed at this interface which improves the wetting angle and eliminates beading up of liquid silicon due to non-wetting. Therefore, interfacial stresses occurring during the zone-melting recrystallization are reduced.

As is seen from FIG. 2, the scanning of the laser beam 9 across the top of the SOI structure causes the poly-silicon or $\alpha$-Si layer 3, to become molten silicon (portion 6) which thereafter recrystallizes into single-crystalline silicon portion 7. The encapsulation layer in accordance with this invention permits the recrystallization of the silicon to occur in a manner so as to avoid the difficulties found in the prior art processes.

The thickness of the two encapsulating layers 4 and 5 can be varied over a wide range, and the dopant for the $SiO_2$ layer can be phosphorus, boron, arsenic or preferably a combination of boron and phosphorous. The laser beam 9 can be supplied by an argon laser in the visible spectrum or a $CO_2$ laser in the infrared range. Also graphite strip heaters, tungsten halogen lamps, mercury arc lamps, and electron beams may be utilized in the zone melting of the polycrystalline silicon layer 3.

In certain applications, depending on the requirements of the thin film device to be fabricated it is desirable to retain the very high resistivity of the near intrinsic LPCVD poly-Si and to prevent leaching of dopant from the encapsulating silicate glass layer. This can be accomplished by the CVD deposition of additional thin continuous $Si_3N_4$ layer on silicon layer 3 to separate it from the silicate glass layer 4. The additional layer need be only 40–50 Angstroms thick and acts as a diffusion barrier to prevent phosphorous and boron dopant leaching from the silicate glass above.

Although the present invention has been described in conjunction with preferred embodiments, it is to be understood that modifications and variations may be resorted to without departing from the spirit of the invention as those skilled in the art will readily understand. Such modifications and variations are considered to be within the purview and scope of the invention and the appended claims to follows.

WHAT WE CLAIM:

1. A method of manufacturing a silicon-on-insulator (SOI) semiconductor device comprising the steps of
   forming a layer of $SiO_2$ on a substrate
   forming a relatively thin poly-silicon or $\alpha$-Si film on said layer of $SiO_2$
   encapsulating said poly-silicon film with a composite structure of a doped layer of $SiO_2$ deposited on said poly-silicon film and a layer of $Si_3N_4$ deposited on said doped layer of $SiO_2$.

2. The method as claimed in claim 1, wherein said $SiO_2$ is doped with a dopant selected from the group consisting of phosphorus, boron and arsenic.

3. The method as claimed in claim 1, wherein said $SiO_2$ is doped with a dopant comprising boron and phosphorous.

4. The method as claimed in claim 1, further including the step of zone-melting said poly-silicon film or $\alpha$-silicon through said composite structure to recrystallize said poly-silicon film.

5. The method as claimed in claim 4, wherein said zone melting is accomplished with the use of radiation emitted by a laser.

6. The method as claimed in claim 1, wherein said poly-silicon film (or $\alpha$-Si) is formed by low pressure chemical vapor deposition.

7. The method as claimed in claim 1, wherein said layer of $Si_3N_4$ is deposited by means of low-pressure chemical deposition.

8. A method of manufacturing a single crystalline silicon-on-insulator (SOI) semiconductor structure comprising the steps of
   forming a layer of $SiO_2$ on a substrate
   forming a thin poly-silicon film or $\alpha$-silicon on said layer of $SiO_2$
   encapsulating said poly-silicon film with a composite structure of a doped layer of $SiO_2$ deposited on said poly-silicon film and a layer of $Si_3N_4$ deposited on said doped layer of $SiO_2$
   zone-melting said poly-silicon film through said composite structure to recrystallize said poly-silicon film.

9. The method as claimed in claim 8, wherein said $SiO_2$ is doped with a dopant selected from the group consisting of phosphorus, boron and arsenic.

10. The method as claimed in claim 8, wherein said $SiO_2$ is doped with a dopant comprising boron and phosphorous.

11. The method as claimed in claim 8, further including the step of zone-melting said poly-silicon film through said composite structure to recrystallize said poly-silicon film.

12. The method as claimed in claim 8, wherein said zone melting is accomplished with the use of radiation emitted by a laser.

13. The method as claimed in claim 8, wherein said poly-silicon film is formed by low pressure chemical vapor deposition.

14. The method as claimed in claim 8, wherein said layer of $Si_3N_4$ is deposited by means of low-pressure chemical deposition.

* * * * *